United States Patent [19]
Sexton

[11] Patent Number: 5,790,596
[45] Date of Patent: Aug. 4, 1998

[54] RADIOTELEPHONE COMMUNICATION UNIT DISPLAYING CHRONOLOGICAL INFORMATION

[75] Inventor: Thomas A. Sexton, Schaumburg, Ill.

[73] Assignee: Motorola, Inc., Schaumburg, Ill.

[21] Appl. No.: 616,794

[22] Filed: Mar. 15, 1996

[51] Int. Cl.$^6$ .............................. H04B 17/00; H04Q 1/20
[52] U.S. Cl. .................... 375/228; 375/341; 375/346; 371/43
[58] Field of Search ............................... 375/200, 224, 375/228, 227, 262, 340, 341, 346, 349; 371/43

[56] References Cited

U.S. PATENT DOCUMENTS

| | | | |
|---|---|---|---|
| 5,265,122 | 11/1993 | Rasky et al. | |
| 5,323,421 | 6/1994 | LaRosa et al. | 375/224 |
| 5,351,274 | 9/1994 | Chennakeshu et al. | |
| 5,465,269 | 11/1995 | Schaffner et al. | |
| 5,471,471 | 11/1995 | Freeburg et al. | |
| 5,497,401 | 3/1996 | Ramaswamy et al. | 375/341 |
| 5,559,757 | 9/1996 | Catipovic et al. | 367/134 |

OTHER PUBLICATIONS

Pooi Yuen Kam et al., "An Adaptive Receiver with Memory for Slowly Fading Channels", IEEE Transactions on Communications, vol. COM-32, No. 6, Jun. 1984.

*Primary Examiner*—Don N. Vo
*Attorney, Agent, or Firm*—Heather L. Creps

[57] ABSTRACT

The method includes receiving a signal comprising a received frame, the received frame having a plurality of received symbols and having a received information portion and a received frame quality indicator; storing at least one of the plurality of received symbols in a memory; demodulating the received information portion to form a demodulated information portion and demodulating the received frame quality indicator to form a demodulated frame quality indicator, the demodulated information portion and the demodulated frame quality indicator comprising a demodulated frame; re-encoding at least a portion of the demodulated frame to form an encoded frame, the encoded frame having a plurality of encoded symbols; comparing one of the plurality of encoded symbols with the at least one of the plurality of received symbols stored in the memory; and based on the comparison, estimating the channel parameter.

18 Claims, 3 Drawing Sheets

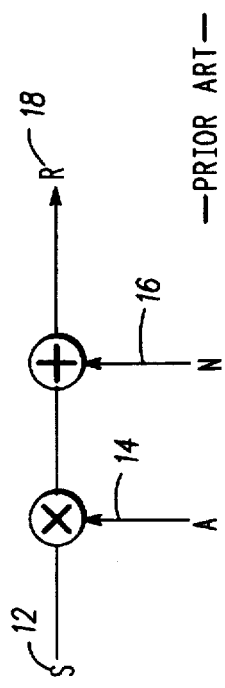
*FIG.1* —PRIOR ART—
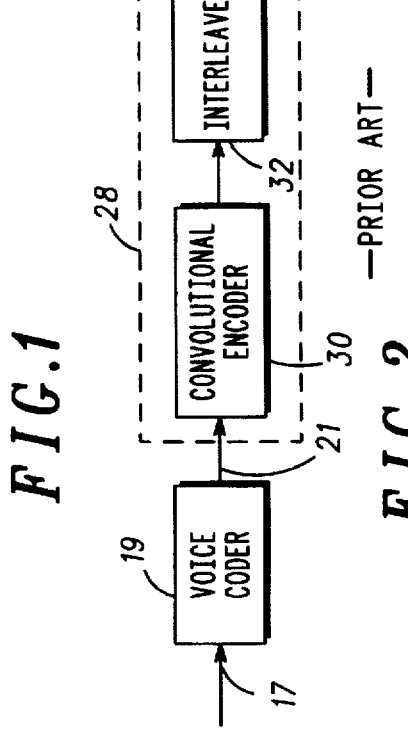
*FIG.2* —PRIOR ART—
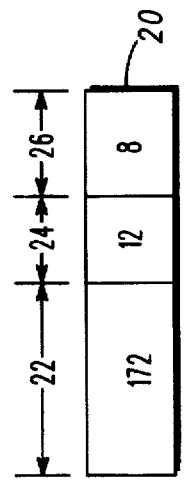
*FIG.3* —PRIOR ART—

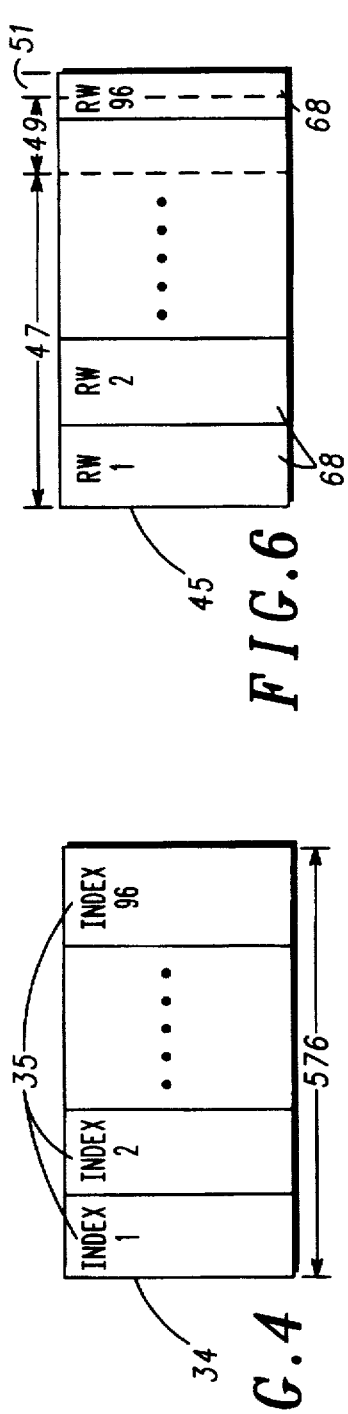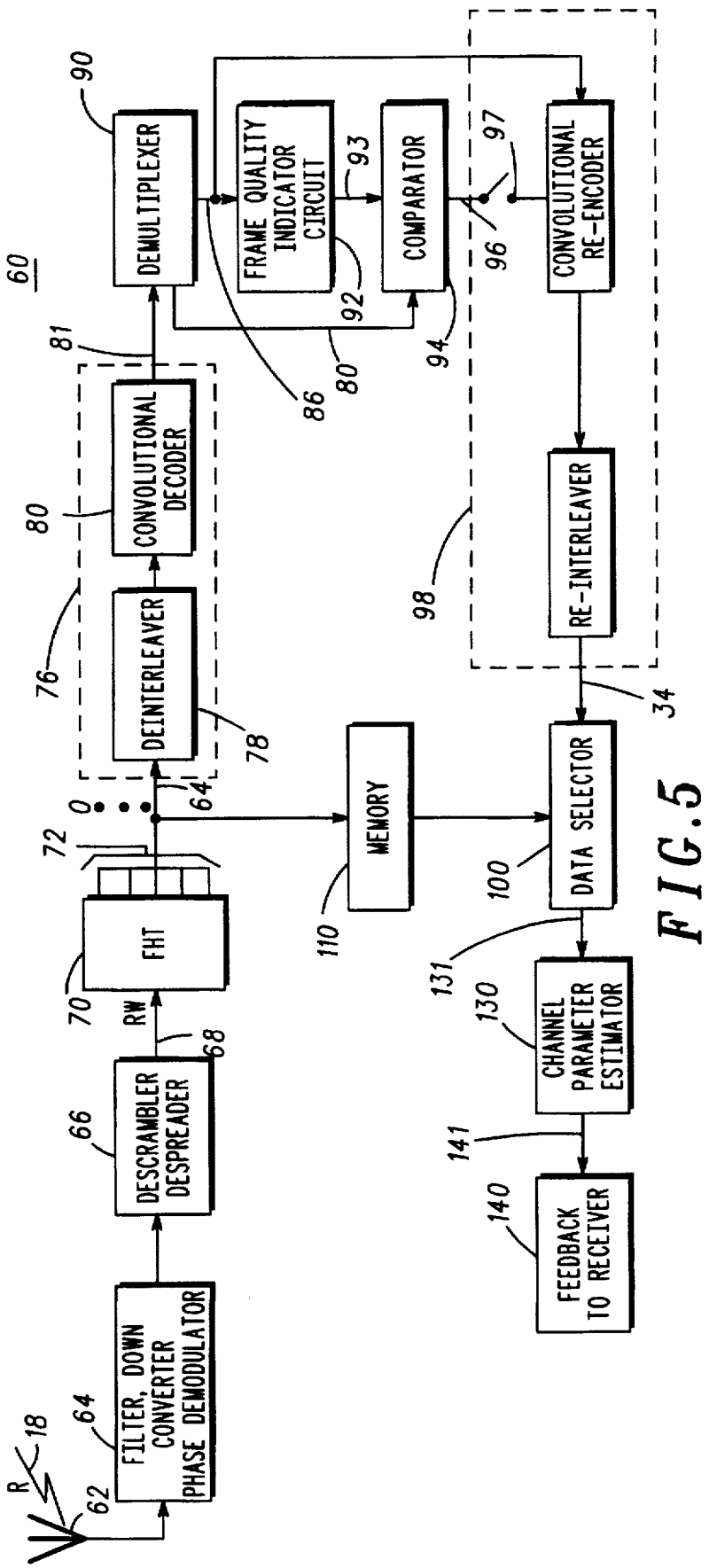

5,790,596

RADIOTELEPHONE COMMUNICATION UNIT DISPLAYING CHRONOLOGICAL INFORMATION

FIELD OF THE INVENTION

This invention relates generally to wireless communication systems, and, more particularly, to a method and apparatus for estimating a channel parameter in a digital radio frequency communication system.

BACKGROUND OF THE INVENTION

In a typical wireless communication system such as a digital radiotelephone system, a base station having a controller and a plurality of transmitters and receivers communicates with mobile stations operating within an area served by the base station.

Multiple access wireless communication between the base station and the mobile stations occurs via radio frequency (RF) channels which provide physical paths over which digital communication signals such as voice, data and video are transmitted. Base-to-mobile station communications are said to occur on a forward-link channel, while mobile-to-base station communications are referred to as being on a reverse-link channel.

Well-known RF digital channelization techniques include time division multiple access (TDMA) and code division multiple access (CDMA). communication system using CDMA channelization is described in detail in TIA/EIA Interim Standard IS-95, Mobile Station-Base Station Compatibility Standard for Dual-Mode Wideband Spread Spectrum Cellular System, Telecommunications Industry Association, Washington, D.C. July 1993, incorporated herein by reference.

Transmitting a communication signal over an RF channel through a medium such as air causes a received communication signal to significantly differ from an originally transmitted communication signal. As shown in FIG. 1, a transmitted communication signal S 12 may be altered during transmission over a channel by a slowly-changing channel parameter A 14, which represents, for example, a channel gain and a phase shift, and may further be corrupted by a channel variable representing an amount of noise N 16. Thus, a received communication signal R 18 may often be represented by a linear expression such as R=A×S+N.

A quality of recovery of transmitted communication signal S 12 from received signal R 18 may be enhanced by accurately estimating slowly-changing channel parameter A 14. Inaccurate estimation of slowly-changing channel parameter A 14 may significantly degrade a receiver's performance.

There is therefore a need for an improved method and apparatus for estimating a slowly-changing channel parameter in a digital wireless communication system.

SUMMARY OF THE INVENTION

According to an aspect of the present invention, the foregoing need is addressed by a method for estimating a channel parameter in a digital radio frequency communication system, which includes receiving a signal comprising a received frame, the received frame having a plurality of received symbols and having a received information portion and a received frame quality indicator; storing at least one of the plurality of received symbols in a memory; demodulating the received information portion to form a demodulated information portion and demodulating the received frame quality indicator to form a demodulated frame quality indicator, the demodulated information portion and the demodulated frame quality indicator comprising a demodulated frame; re-encoding at least a portion of the demodulated frame to form an encoded frame, the encoded frame having a plurality of encoded symbols; comparing one of the plurality of encoded symbols with the at least one of the plurality of received symbols stored in the memory; and based on the comparison, estimating the channel parameter.

According to another aspect of the present invention, a method for estimating a channel parameter in a digital radio frequency communication system includes receiving a signal comprising a received frame, the received frame having a plurality of received symbols associated with a plurality of transmitted symbols and having a received information portion and a received frame quality indicator; inputting one of the plurality of received symbols to a demodulator having a number of outputs; storing at least one of the number of outputs in a memory; demodulating the received information portion to form a demodulated information portion and demodulating the received frame quality indicator to form a demodulated frame quality indicator, the demodulated information portion and the demodulated frame quality indicator comprising a demodulated frame; re-encoding at least a portion of the demodulated frame to form an encoded frame, the encoded frame having a plurality of encoded symbols; comparing one of the plurality of encoded symbols with the at least one of the number of outputs stored in the memory; and based on the comparison, estimating the channel parameter.

According to a further aspect of the present invention, an apparatus for estimating a channel parameter in a digital radio frequency communication system includes an antenna receiving a signal including a received frame. The received frame has a plurality of received symbols. A memory which stores at least one of the plurality of received symbols is responsive to the antenna. A demodulator is responsive to the received frame, and forms a demodulated frame. A re-encoder is responsive to the demodulated frame, forming an encoded frame having a plurality of encoded symbols. A comparator is responsive to the plurality of encoded symbols and responsive to the at least one of the plurality of received symbols stored in the memory.

According to a still further aspect of the present invention, an apparatus for estimating a channel parameter in a digital radio frequency communication system includes an antenna receiving a signal including a received frame. The received frame has a plurality of received symbols and has a received information portion and a received frame quality indicator. A first demodulator has a number of outputs and is responsive to at least one of the plurality of received symbols. A memory storing at least one of the number of outputs is in communication with the first demodulator. A second demodulator is responsive to the first demodulator, demodulating the received information portion to form a demodulated information portion and demodulating the received frame quality indicator to form a demodulated frame quality indicator. The demodulated information portion and the demodulated frame quality indicator comprise a demodulated frame. A frame quality indicator circuit, which calculates a re-computed frame quality indicator, is responsive to the demodulated information portion. A first comparator has a first input, a second input and an output, the first input is responsive to the demodulated frame quality indicator and the second input is responsive to the re-computed frame quality indicator. A re-encoder is responsive to the output of the comparator, encoding the demodulated frame to form an encoded frame, the encoded frame having a plurality of encoded symbols. A second comparator is responsive to the plurality of encoded symbols and responsive to the at least one of the number of outputs stored in the memory. A channel parameter which is responsive to the second comparator estimator outputs the channel parameter.

Advantages of the present invention will become readily apparent to those skilled in the art from the following description of the preferred embodiment of the invention which has been shown and described by way of illustration. As will be realized, the invention is capable of other and different embodiments, and its details are capable of modifications in various respects. Accordingly, the drawings and description are to be regarded as illustrative in nature, and not as restrictive.

BRIEF DESCRIPTION OF THE DRAWINGS

FIG. 1 is an example of a transmitted communication signal S which has been altered during transmission by channel parameter A and noise N, resulting in received communication signal R.

FIG. 2 is a block diagram of a transmitter for generating a communication signal waveform compatible with the reverse-link channel of IS-95.

FIG. 3 is a diagram of an IS-95 reverse-link channel frame for transmission at a rate of 9600 bits per second.

FIG. 4 is a diagram of a digitally encoded and interleaved frame created by the transmitter of FIG. 2.

FIG. 5 is a block diagram of a receiver for receiving the communication signal waveform generated by the transmitter depicted in FIG. 2, according to a preferred embodiment of the present invention.

FIG. 6 is a diagram of a received frame in the IS-95 reverse-link channel receiver illustrated in FIG. 5.

DETAILED DESCRIPTION OF THE PREFERRED EMBODIMENTS

Figure 7:
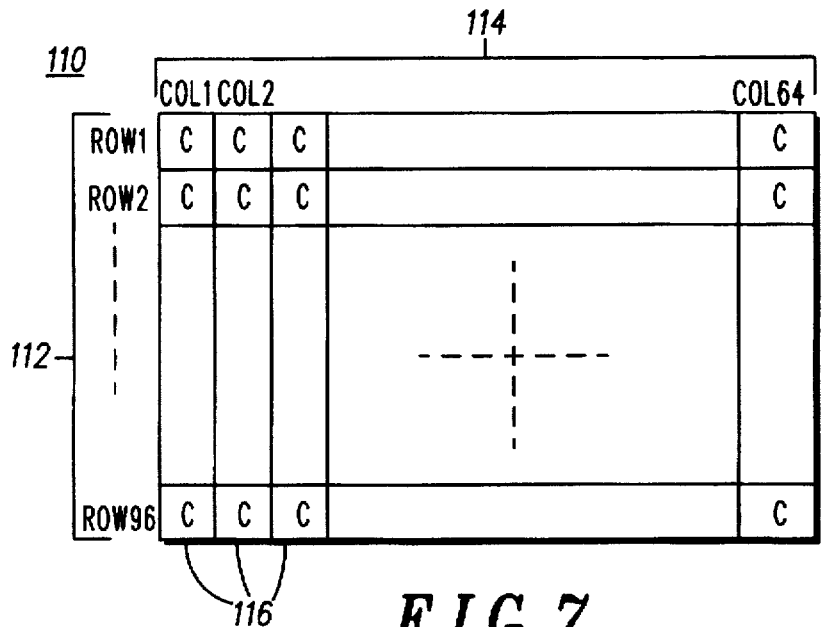
FIG. 7 is a diagram of one embodiment of a memory for use in the receiver illustrated in FIG. 5.

Turning now to the drawings, wherein like numerals designate like components, FIG. 2 is a block diagram of a transmitter 10 for generating a communication signal waveform compatible with the reverse-link channel of IS-95. A voice communication signal 17 is converted to a data bit stream by a variable-rate voice-coder 19, which produces a signal 21 comprised of a series of transmit channel frames (discussed further below) having varying transmit data rates. The transmit data rate of each frame depends on the characteristics of the communication signal 17. Of course, communication signal 17 may be of another type, for example, data or video.

FIG. 3 is a diagram of an IS-95 reverse-link transmit channel frame 20, produced by voice-coder 19, for transmission at a rate of 9600 bits per second (bps) (unless otherwise specified, all IS-95 reverse-link channel examples herein correspond to a 9600 bps transmission rate). Frame 20 includes: an information portion 22 having 172 information bits; a frame quality indicator portion 24, calculated from information portion 22 according to a polynomial set forth in IS-95, at sec. 6.1.3.3.2.1 of IS-95; and eight encoder tail bits 26.

Referring to FIG. 2, encoder block 28 includes a convolutional encoder 30 and an interleaver 32. At convolutional encoder 30, each frame 20 may be encoded by a rate ⅓ encoder using well-known algorithms which facilitate subsequent decoding of frames 20. Interleaver 32 operates to shuffle the contents of frames 20 using commonly-known techniques.

As shown in FIG. 4, each frame 34 of digitally coded and interleaved bits includes ninety-six groups of six coded bits, for a total of 576 bits. Each group of six coded bits represents an index 35 to one of sixty-four symbols such as Walsh codes. A Walsh code corresponds to a single row or column of a sixty-four-by-sixty-four Hadamard matrix, a square matrix of bits with a dimension that is a power of two.

Referring again to FIG. 2, each of the ninety-six Walsh code indices 35 in frame 34 are input to an M-ary orthogonal modulator 36, which is preferably a sixty-four-ary orthogonal modulator. For each input Walsh code index 35, M-ary orthogonal modulator 36 generates at output 38 a corresponding sixty-four-bit Walsh code W 39. Thus, a series of ninety-six Walsh codes W 39 is generated for each frame 34 input to M-ary orthogonal modulator 36.

Scrambler/spreader block 40, among other things, applies a pseudorandom noise (PN) sequence to the series of Walsh codes W 39 using well-known scrambling techniques. At block 42, the scrambled series of Walsh codes W 39 is phase modulated using a quadrature amplitude modulation process or another modulation process, up-converted and transmitted as communication signal S 12 from antenna 46.

FIG. 5 is a block diagram of a receiver 60, constructed according to a preferred embodiment of the present invention, that is compatible with the reverse link of IS-95 for detecting the communication signal S 12 generated by the transmitter depicted in FIG. 2. Receiver 60 is preferably a RAKE receiver having a number of fingers, although only a single finger is shown. Receiver 60 may be coherent, non-coherent or quasi-coherent.

Antenna 62 receives communication signal R 18, which comprises a number of received frames (discussed further below). Communication signal R 18, as illustrated and discussed in connection with FIG. 1, may be related to communication signal S 12 by the expression R 18=A 14×S 12+N 16, where A 14 is a slowly-changing channel parameter such as a channel gain or a phase shift, and N 16 is a channel variable representing an amount of noise.

Front-end processing such as filtering, frequency down-converting and phase demodulation of communication signal R 18 is performed by well-known methods and circuits at block 64. De-scrambler/de-spreader block 66, among other things, removes the PN code applied by scrambler block 44 (shown in FIG. 2) to the series of Walsh codes W 39 (also shown in FIG. 2). In the IS-95 reverse-link channel, a received frame (discussed further below) of received signal 18 includes ninety-six received symbols, or Walsh codes, which are each sixty-four bits long.

FIG. 6 is a diagram representing a received frame 45 that has emerged from de-scrambler/de-spreader block 66. Received frame 45 includes ninety-six received Walsh codes RW 68, which have been corrupted by, for example, a slowly-changing channel parameter such as A 14 (shown in FIG. 1) and a channel variable such as N 16 (also shown in FIG. 1). In addition, received frame 45 has a received information portion 47, a received frame quality indicator 49 and a received encoder tail bit portion 51, none of which is explicitly associated with any one received Walsh code RW 68.

Referring again to FIG. 5, each received Walsh code RW 68, after leaving de-scrambler/de-spreader 66, is input to an orthogonal demodulator 70, such as a Fast Hadamard Transform (FHT). FHT 70 may be implemented using commercially available hardware as an array of adders or as a multiplexed adder, depending on its size. Alternatively, FHT 70 may be implemented utilizing a conventional digital signal processor (DSP) such as a Motorola DSP, part no. 56166.

Upon receiving a received Walsh code RW 68, FHT 70 generates a number of output signals 72. Sixty-four output signals 72 are generated per received Walsh code RW 68 in the IS-95 reverse-link channel. Each output signal 72 has an index which references one of the sixty-four possible Walsh codes W 39 generated by M-ary orthogonal modulator 36 (shown in FIG. 2). Thus, in the IS-95 reverse link channel, when a received Walsh code RW 68 is input to FHT 70, sixty-four output signals 72 which correlate to sixty-four possible transmitted Walsh codes 39 are produced. It should be understood that in addition to having an index, each output signal 72 also has an associated complex number, C. For simplicity, the index and the complex number will be referred to collectively as output signal 72.

Each output signal 72 further has an associated energy value $C^2$ (not shown), commonly calculated by magnitude-squaring the complex number C associated with output signal 72. The energy value $C^2$ generally corresponds to a measure of confidence, or a likelihood, that output signal 72 indexes a Walsh code W 39 which corresponds to received Walsh code RW 68 input to FHT 70. In about twenty percent of the cases, however, the energy value $C^2$ representing the highest measure of confidence is wrong—that is, output signal 72 associated with energy value $C^2$ does not actually index a Walsh code W 39 which was transmitted.

In accordance with a preferred embodiment of the present invention, a memory 110, which may be a commercially available computer-readable random-access memory, for example, is positioned at a point within receiver 60. As shown, memory 110 is responsive to FHT 70. Memory 110 preferably stores the complex numbers C associated with each of the sixty-four output signals 72, for each of the ninety-six received Walsh codes RW 68 per received frame 45 which are input to FHT 70.

FIG. 7 is an illustrative diagram of one embodiment of a memory for use in the receiver illustrated in FIG. 5.

For a single received frame 45 (shown in FIG. 6), memory 110 may be viewed as a matrix having ninety-six rows 112 and sixty-four columns 114, each row 112 corresponding to a particular received Walsh code RW 68 input to FHT 70, and each column 114 representing the sixty-four complex numbers C 116 associated with output signals 72. The index of each complex number is implied by its position in memory 110.

Alternatively, memory 110 may store less than the all of the sixty-four output signals 72 generated by FHT 70 for each received Walsh code RW 68. For example, memory 110 may retain only one output signal 72 per received Walsh code RW 68, the one output signal 72 saved having an energy value $C^2$ corresponding to a highest measure of confidence, or a highest likelihood, that the saved output signal 72 indexes a Walsh code W 39 which corresponds to received Walsh code RW 68 input to FHT 70.

Figure 8:
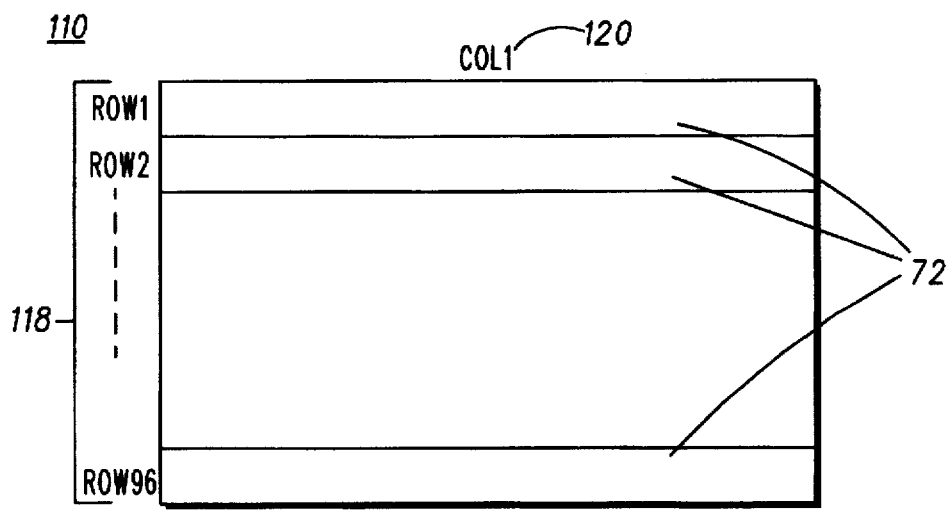
FIG. 8 is a diagram of an alternative embodiment of the memory for use in the receiver illustrated in FIG. 5.

FIG. 8 is an illustrative diagram of an alternative embodiment of memory 110 for use in receiver 60 illustrated in FIG. 5. As shown, memory 110 for a single received frame 45 may be viewed as a matrix having ninety-six rows 118 and one column 120, each row representing one output signal 72 corresponding to the highest likelihood that the output signal 72 indexes a Walsh code W 39 which corresponds to received Walsh code RW 68 input to FHT 70. Each row of memory 110 stores the complex number C and the index associated with stored output signal 72.

Referring again to FIG. 5, decoder block 76, which may include a de-interleaver 78 and a convolutional decoder 80, further demodulates received signal R 18, estimating transmitted signal 21 (shown in FIG. 2), which is comprised of a series of channel frames, to form a series of demodulated frames (discussed further below). Decoder block 76 may be implemented in a variety of ways. For example, a Maximum Likelihood decoder, implemented in hardware or software according to well-known methods, may be used within decoder block 76.

Figure 9:
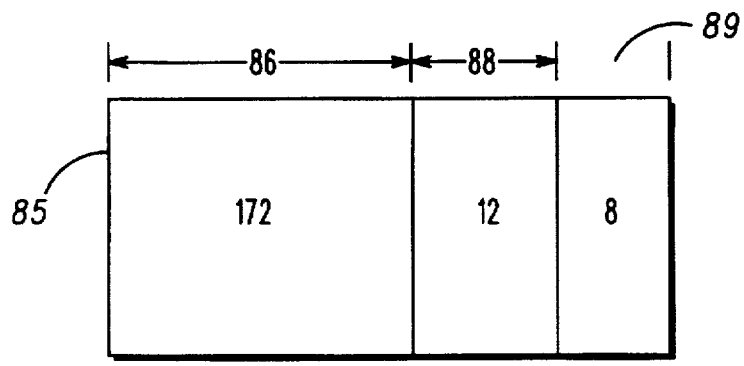
FIG. 9 is a diagram of a demodulated frame in the IS-95 reverse-link channel receiver illustrated in FIG. 5.

FIG. 9 illustrates a demodulated frame 85 which appears at output 81 of decoder block 76. Demodulated frame 85 includes a demodulated information portion 86, a demodulated frame quality indicator 88, and may also include a demodulated tail bit portion 89. Demodulated information portion 86 corresponds to received information portion 47 (shown in FIG. 6), while demodulated frame quality indicator 88 and demodulated tail bit portion 89 correspond to received frame quality indicator 49 and received tail bit portion 51, respectively (also shown in FIG. 6).

Referring again to FIG. 5, and also to FIGS. 1–4 and 5–9 as necessary, a demultiplexer 90 separates demodulated information portion 86 of frame 85 from demodulated frame quality indicator 88. Frame quality indicator circuit 92 uses demodulated portion 86 to calculate a re-computed frame quality indicator 93. Recomputed frame quality indicator 93 is then compared to demodulated frame quality indicator 88 at comparator 94, to determine whether a particular demodulated frame 85 matches a particular channel frame 20 produced by voice-coder 19.

When demodulated frame 85 does not match channel frame 20, it fails, and is discarded by switch 96 at point 97.

When demodulated frame 85 matches transmit channel frame 20, demodulated frame 85 passes. Although demodulated frame 85 has been successfully decoded, and communication signal S 12 has been retrieved, demodulated frame 85 no longer contains channel parameter information such as channel gain and phase shift A 14, which would be useful for improving receiver performance for subsequent frames.

As shown in FIG. 5, demodulated frame 85 has passed. Demodulated information portion 86 is passed by switch 96 at point 91 to re-encoder block 98, which is preferably substantially similar to encoder block 28, depicted in FIG. 2. Thus, an encoded frame 34 exiting re-encoder block 98 is essentially a reproduction of frame 34 (shown in FIG. 4). As illustrated in FIG. 4, encoded frame 34 includes up to ninety-six groups of six coded bits, each group of six coded bits representing an index 35 to one of sixty-four Walsh codes.

Referring again to FIG. 5, data selector 100 compares a particular encoded index 35 (shown in FIG. 4) of a particular frame 34 received from re-encoder block 98 to a received symbol stored in memory 110. When memory 110 is formed as described in connection with FIG. 7, for example, data selector 100 uses the particular encoded index 35 to address a memory location containing the complex number 116 corresponding to the actually transmitted Walsh code W 39. The addressed stored output signal 72 may be forwarded by a data selector output 131 to channel parameter estimator 130, and used to estimate a slowly-changing channel parameter (discussed further below). This process may be performed for each row 112 in memory 110.

When memory 110 is formed as described in connection with FIG. 8, that is, when only one output signal 72 having the highest likelihood of representing the transmitted Walsh code W 39 for each received Walsh code RW 68 input to FHT 70 has been stored, data selector 100 compares the particular encoded index 35 to the index corresponding to stored output signal 72. If there is no match, the un-matched stored output signal 72 may be erased from memory, and a zero may be output by data selector output 131, so that an erroneous output signal 72 does not detract from accurate estimation of a slowly-changing channel parameter at block 130. If there is a match, the matched stored output signal 72 may be forwarded by data selector output 131 and used to estimate a slowly-changing channel parameter at channel parameter estimator 130.

Referring to FIGS. 1 and 5, a slowly-changing channel parameter such as A 14, which may represent a channel gain or a phase shift, is estimated at block 130. It can be seen that slowly-changing channel parameter A 14 may be approximated as a standard inner product of R with the complex conjugate of S, <R, S*>. A particular representation of R is known, having been captured in memory 110 at the output of FHT 70 as a number of stored output signals 72. Values of S corresponding to the stored R are given by indices 35 of encoded frames 34 (shown in FIG. 4) exiting re-encoder block 98. Because data selector 100 forwards to channel parameter estimator 130 either stored output signals 72 which have been matched to a corresponding index 35, or zero values, a calculation of <R, S*> for a particular frame at channel estimator 130 is generally corrupted only by an amount of noise N 16. To reduce energy from noise N 16, the calculation <R, S*> of channel parameter A 14 may be averaged over a period of time, for example, for several frames.

Referring to FIG. 5, feedback block 140, which is responsive to an output 141 of channel parameter estimator 130, makes use of channel parameter output 141 in various ways to enhance receiver performance. For example, an estimate of channel parameter A 14 allows for improved combining between diversity elements, such as fingers in a RAKE receiver, to reduce bit or frame errors at a given signal-to-noise ratio. In another example, a channel phase estimate allows a coherent receiver to obtain an absolute phase of a received signal, which is in turn used to reconstruct a phase of a transmitted signal. Accurately estimating the channel phase reduces bit or frame errors for a given received signal-to-noise ratio.

Enhanced receiver performance in, for example, a digital wireless telecommunication system results in calls being established more quickly and reduces occurances of dropped calls. A greater receiver range may also be realized, facilitating call handoff.

As will be appreciated, other, often non-linear, forms of received communication signal R 18 exist for other channel parameters of interest, such as timing errors, mobile station speed and variance of additive noise for each diversity element such as a RAKE receiver finger. These channel parameters and still others may also benefit from improved estimation by use of the various embodiments of the present invention, to obtain improved data fed to an appropriate estimator.

The principles of the present invention which apply to cellular-based digital communication systems may also apply to other types of communication systems, including but not limited to personal communication systems, trunked systems, satellite communication systems and data networks. Likewise, the principles of the present invention which apply to all types of digital radio frequency channels also apply to other types of communication channels, such as radio frequency signaling channels, electronic data buses, wireline channels, optical fiber links and satellite links.

Although the IS-95 reverse link channel has been specifically referred to herein, the present invention is applicable to any digital channel, including but not limited to the forward-link IS-95 channel and to all forward- and reverse-link TDMA channels, in all TDMA systems, such as Groupe Special Mobile (GSM), a European TDMA system, Pacific Digital Cellular (PDC), a Japanese TDMA system, and Interim Standard 54 (IS-54), a U.S. TDMA system.

It will furthermore be apparent that other and further forms of the invention, and embodiments other than the specific embodiments described above, may be devised without departing from the spirit and scope of the appended claims and their equivalents, and therefore it is intended that the scope of this invention will only be governed by the following claims and their equivalents.

I claim:

1. A method for estimating a channel parameter in a digital radio frequency communication system, the method comprising the steps of:

receiving a signal comprising a received frame, the received frame having a plurality of received symbols and having a received information portion and a received frame quality indicator;

storing at least one of the plurality of received symbols in a memory;

demodulating the received information portion to form a demodulated information portion and demodulating the received frame quality indicator to form a demodulated frame quality indicator, the demodulated information portion and the demodulated frame quality indicator comprising a demodulated frame;

re-encoding at least a portion of the demodulated frame to form an encoded frame, the encoded frame having a plurality of encoded symbols;

comparing one of the plurality of encoded symbols with the at least one of the plurality of received symbols stored in the memory; and based on the comparison, estimating the channel parameter.

2. The method according to claim 1, further comprising the steps of:

based on the demodulated information portion, calculating a re-computed frame quality indicator;

comparing the demodulated frame quality indicator with the re-computed frame quality indicator; and based on the comparison, re-encoding at least a portion of the demodulated frame.

3. The method according to claim 1, further comprising the step of:

estimating the channel parameter using the at least one of the plurality of received symbols, when the at least one of the plurality of received symbols corresponds to the one of the plurality of encoded symbols.

4. The method according to claim 1, further comprising the step of:

erasing the at least one of the plurality of received symbols stored in the memory, when the at least one of the plurality of received symbols does not correspond to the one of the plurality of encoded symbols.

5. A method for estimating a channel parameter in a digital radio frequency communication system, the method comprising the steps of:

receiving a signal comprising a received frame, the received frame having a plurality of received symbols associated with a plurality of transmitted symbols and having a received information portion and a received frame quality indicator;

inputting one of the plurality of received symbols to a demodulator having a number of outputs;

storing at least one of the number of outputs in a memory;

demodulating the received information portion to form a demodulated information portion and demodulating the received frame quality indicator to form a demodulated frame quality indicator, the demodulated information portion and the demodulated frame quality indicator comprising a demodulated frame;

re-encoding at least a portion of the demodulated frame to form an encoded frame, the encoded frame having a plurality of encoded symbols;

comparing one of the plurality of encoded symbols with the at least one of the number of outputs stored in the memory; and based on the comparison, estimating the channel parameter.

6. The method according to claim 5, wherein each of the number of outputs has a value, the value representing a likelihood that the one of the plurality of received symbols corresponds to one of the plurality of transmitted symbols.

7. The method according to claim 6, wherein the step of storing at least one of the number of outputs in the memory comprises storing the output having the value representing the greatest likelihood.

8. The method according to claim 7, wherein the step of estimating the channel parameter comprises the selecting the output having the value representing the greatest likelihood when the output corresponds to the one of the plurality of encoded symbols.

9. The method according to claim 7, wherein the step of estimating the channel parameter comprises erasing from the memory the output having the value representing the greatest likelihood when the output does not correspond to the one of the plurality of encoded symbols.

10. The method according to claim 6, wherein the step of storing at least one of the number of outputs in the memory comprises storing each of the number of outputs in the memory.

11. The method according to claim 10, further comprising the step of:

identifying one output of each of the number of outputs, the one output being addressed by the encoded symbol.

12. The method according to claim 11, wherein the step of estimating the channel parameter comprises using the one output to estimate the channel parameter.

13. The method according to claim 5, wherein the channel parameter is selected from the group consisting essentially of: a speed of a mobile communication unit, a frequency offset, a timing error, a faded amplitude of the signal, a faded phase of the signal, and a variance of an additive noise.

14. The method according to claim 5, wherein the demodulator comprises a Fast Hadamard Transform.

15. The method according to claim 5, wherein each of the number of outputs comprises a Walsh code index.

16. The method according to claim 5, wherein each of the number of outputs comprises a complex number.

17. The method according to claim 5, wherein the received symbol comprises a Walsh code.

18. An apparatus for estimating a channel parameter in a digital radio frequency communication system, the apparatus comprising:

an antenna receiving a signal comprising a received frame, the received frame having a plurality of received symbols and having a received information portion and a received frame quality indicator;

a first demodulator having a number of outputs and being responsive to at least one of the plurality of received symbols;

a memory in communication with the first demodulator, the memory storing at least one of the number of outputs;

a second demodulator responsive to the first demodulator, demodulating the received information portion to form a demodulated information portion and demodulating the received frame quality indicator to form a demodulated frame quality indicator, the demodulated information portion and the demodulated frame quality indicator comprising a demodulated frame;

a frame quality indicator circuit responsive to the demodulated information portion, calculating a recomputed frame quality indicator;

a first comparator having a first input, a second input and an output, the first input responsive to the demodulated frame quality indicator and the second input responsive to the re-computed frame quality indicator;

a re-encoder responsive to the output of the comparator, encoding the demodulated frame to form an encoded frame, the encoded frame having a plurality of encoded symbols;

a second comparator responsive to the plurality of encoded symbols and responsive to the at least one of the number of outputs stored in the memory; and a channel parameter estimator outputting the channel parameter, the channel parameter estimator responsive to the second comparator.

* * * * *